United States Patent
Qian et al.

(10) Patent No.: US 9,314,897 B2
(45) Date of Patent: Apr. 19, 2016

(54) CHEMICAL MECHANICAL POLISHING PAD WITH ENDPOINT DETECTION WINDOW

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Marty W. DeGroot, Middletown, DE (US)

(73) Assignees: Rohm and Haas Electronic Materials CMP Holdings, Inc., Newark, DE (US); Dow Global Technologies LLC, Midland, MI (US)

( * ) Notice: Subject to any disclaimer, the term of this patent is extended or adjusted under 35 U.S.C. 154(b) by 16 days.

(21) Appl. No.: 14/264,440

(22) Filed: Apr. 29, 2014

(65) Prior Publication Data
US 2015/0306729 A1 Oct. 29, 2015

(51) Int. Cl.
| | |
|---|---|
| B24B 37/20 | (2012.01) |
| B24B 37/013 | (2012.01) |
| G02B 1/12 | (2006.01) |
| H01F 41/00 | (2006.01) |
| B24B 37/24 | (2012.01) |
| B24B 49/12 | (2006.01) |
| H01L 21/306 | (2006.01) |

(52) U.S. Cl.
CPC ............. *B24B 37/205* (2013.01); *B24B 37/013* (2013.01); *B24B 37/24* (2013.01); *B24B 49/12* (2013.01); *G02B 1/12* (2013.01); *H01F 41/00* (2013.01); *H01L 21/30625* (2013.01)

(58) Field of Classification Search
CPC .... B24B 37/013; B24B 37/205; B24B 37/24; B24B 49/12; G02B 1/12; H01F 41/00; H01L 21/30625
See application file for complete search history.

(56) References Cited

U.S. PATENT DOCUMENTS

| | | | |
|---|---|---|---|
| 6,171,181 | B1 | 1/2001 | Roberts et al. |
| 6,984,163 | B2 | 1/2006 | Roberts |
| 7,018,581 | B2 | 3/2006 | David et al. |
| 7,195,539 | B2 | 3/2007 | Turner et al. |
| 7,258,602 | B2 | 8/2007 | Shih et al. |
| 7,874,894 | B2 | 1/2011 | Fukuda et al. |
| 7,927,183 | B2 | 4/2011 | Fukuda et al. |
| 8,257,544 | B2 | 9/2012 | Kulp et al. |
| 8,257,545 | B2 | 9/2012 | Loyack et al. |
| 8,431,489 | B2 | 4/2013 | Kulp et al. |
| 8,512,427 | B2 | 8/2013 | Xie et al. |

(Continued)

OTHER PUBLICATIONS

Copending U.S. Appl. No. 14/228,613, 2014.

(Continued)

*Primary Examiner* — Shuangyi Abu Ali
(74) *Attorney, Agent, or Firm* — Thomas S. Deibert

(57) ABSTRACT

A chemical mechanical polishing pad is provided containing a polishing layer having a polishing surface; and, an endpoint detection window; wherein the endpoint detection window comprises a reaction product of ingredients, comprising: an isocyanate terminated urethane prepolymer having 5.5 to 9.5 wt % unreacted NCO groups, wherein the isocyanate terminated urethane prepolymer is a reaction product of ingredients comprising: an aromatic polyfunctional isocyanate; and, a prepolymer polyol; and, a curative system, comprising: 0 to 90 wt % of a difunctional curative; and, 10 to 100 wt % of an amine initiated polyol curative having at least one nitrogen atom per molecule and an average of at least three hydroxyl groups per molecule. Also provide are methods of making and using the chemical mechanical polishing pad.

7 Claims, 3 Drawing Sheets

(56) References Cited

U.S. PATENT DOCUMENTS

| | | | |
|---|---|---|---|
| 2003/0171081 A1 | 9/2003 | Komukai et al. | |
| 2006/0276109 A1* | 12/2006 | Roy | B24B 37/042 451/41 |
| 2012/0295442 A1* | 11/2012 | Kulp | B24B 37/205 438/692 |
| 2013/0017769 A1* | 1/2013 | Kimura | B24B 37/22 451/533 |

OTHER PUBLICATIONS

Copending U.S. Appl. No. 14/228,744, 2014.
Copending U.S. Appl. No. 13/906,715, 2013.
Copending U.S. Appl. No. 13/906,765, 2013.
Copending U.S. Appl. No. 13/906,825, 2013.
Copending U.S. Appl. No. 14/228,660, 2014.
Copending U.S. Appl. No. 14/264,576, 2014.

* cited by examiner

CHEMICAL MECHANICAL POLISHING PAD WITH ENDPOINT DETECTION WINDOW

The present invention relates to a chemical mechanical polishing pad with an endpoint detection window. The present invention is also directed to a method of chemical mechanical polishing of a substrate using a chemical mechanical polishing pad with an endpoint detection window.

In the fabrication of integrated circuits and other electronic devices, multiple layers of conducting, semiconducting and dielectric materials are deposited on Or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes nonplanar, Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved rotated) relative to the wafer by an external driving force. Simultaneously therewith, a polishing medium (e.g., slurry) is provided between the wafer and the polishing pad. Thus, the water surface is polished and made planar by the chemical and mechanical action of the pad surface and the polishing medium.

One challenge presented with chemical mechanical polishing is determining when the substrate has been polished to the desired extent. In situ methods for determining polishing endpoints have been developed. The in situ optical end pointing techniques can be divided into two basic categories: (1) monitoring the reflected optical signal at a single wavelength or (2) monitoring the reflected optical signal from multiple wavelengths. Typical wavelengths used for optical end pointing include those in the visible spectrum (e.g., 400 to 700 nm), the ultraviolet spectrum (315 to 400 nm), and the infrared spectrum (e.g., 700 to 1000 nm). In U.S. Pat. No. 5,433,651, Lustig et al disclosed a polymeric endpoint detection method using a single wavelength in which light from a laser source is transmitted on a wafer surface and the reflected signal is monitored. As the composition at the wafer surface changes from one metal to another, the reflectivity changes. This change in reflectivity is then used to detect the polishing endpoint. In U.S. Pat. No. 6,106,662, Bibby et al disclosed using a spectrometer to acquire an intensity spectrum of reflected light in the visible range of the optical spectrum. In metal CMP applications, Bibby et al. teach using the whole spectrum to detect the polishing endpoint.

To accommodate these optical end pointing techniques, chemical mechanical polishing pads have been developed having windows. For example, in U.S. Pat. No. 5,605,760, Roberts discloses a polishing pad wherein at least a portion of the pad is transparent to laser light over a range of wavelengths. In some of the disclosed embodiments, Roberts teaches a polishing pad that includes a transparent window piece in an otherwise opaque pad. The window piece may be a rod or plug of transparent polymer in a molded polishing pad. The rod or plug may be insert molded within the polishing pad (i.e., an "integral window"), or may be installed into a cut out in the polishing pad after the molding operation (i.e., a "plug in place window").

Aliphatic isocyanate based polyurethane materials, such as those described in U.S. Pat. No. 6,984,163 provided improved light transmission over a broad light spectrum. Unfortunately, these aliphatic polyurethane windows, inter alia, tend to lack the requisite durability required for demanding polishing applications.

Conventional polymer based endpoint detection windows often exhibit undesirable degradation upon exposure to light having a wavelength of 330 to 425 nm. Increasingly, however, there is pressure to utilize tight with shorter wavelengths for endpoint detection purposes in semiconductor polishing applications to facilitate thinner material layers and smaller device sizes.

In addition, semiconductor devices are becoming increasingly complex with finer features and more metallization layers. This trend requires improved performance from polishing consumables in order to maintain planarity and limit polishing defects. The latter can create electrical breaks or shorts of the conducting lines that would render the semiconductor device non-functional. It is generally known that one approach to reduce polishing defects, such as micro-scratches or chatter marks, is to use a softer polishing layer material. Accordingly, there is a trend toward using softer polishing layer materials to facilitate improved defectivity performance. Notwithstanding, conventional window formulations do not pair well with such softer polishing layer materials, tending to lead to an increase in polishing defectivity.

Accordingly, there is a continuing need for improved polymeric endpoint detection window formulations for use in chemical mechanical polishing pads. In particular, there is a continuing need for polymeric endpoint detection window formulations exhibiting a hardness of ≤65 Shor D, coupled with an elongation to break of <300% and a double pass transmission at 400 nm, $DPT_{400}$ of 25 to 100%; wherein the window formulations do not exhibit undesirable window deformation and have the required durability for demanding polishing applications.

The present invention provides a chemical mechanical polishing pad, comprising: a polishing layer having a polishing surface; and, an endpoint detection window; wherein the endpoint detection window comprises a reaction product of ingredients, comprising: (i) an isocyanate terminated urethane prepolymer having 5.5 to 9.5 wt % unreacted NCO groups, wherein the isocyanate terminated urethane prepolymer is a reaction product of ingredients comprising: (a) an aromatic polyfunctional isocyanate; and, (b) a prepolymer polyol; and, (ii) a curative system, comprising: 0 to 90 wt % of a difunctional curative; and, 10 to 100 wt % of an amine initiated polyol curative having at least one nitrogen atom per molecule and an average of at least three hydroxyl groups per molecule.

The present invention provides a chemical mechanical polishing pad, comprising: a polishing layer having a polishing surface; and, an endpoint detection window; wherein the endpoint detection window comprises a reaction product of ingredients, comprising: (i) an isocyanate terminated urethane prepolymer having 5.5 to 9.5 wt % unreacted NCO groups, wherein the isocyanate terminated urethane prepolymer is a reaction product of ingredients comprising: (a) an aromatic polyfunctional isocyanate; and, (b) a prepolymer polyol; and, (ii) a curative system, comprising: 0 to 90 wt % of a difunctional curative; and, 10 to 100 wt % of an amine initiated polyol curative having at least one nitrogen atom per molecule and an average of at least three hydroxyl groups per molecule; and, wherein the polishing surface is adapted for polishing a substrate selected from the group consisting of at least one of a magnetic substrate, an optical substrate and a semiconductor substrate.

The present invention provides a chemical mechanical polishing pad, comprising: a polishing layer having a polishing surface; and, an endpoint detection window; wherein the endpoint detection window comprises a reaction product of ingredients, comprising: (i) an isocyanate terminated urethane prepolymer having 5.5 to 9.5 wt % unreacted NCO groups, wherein the isocyanate terminated urethane prepolymer is a reaction product of ingredients comprising: (a) an aromatic polyfunctional isocyanate; and, (b) a prepolymer polyol; and, (ii) a curative system, comprising: 0 to 90 wt % of a difunctional curative; and, 10 to 100 wt % of an amine initiated polyol curative having at least one nitrogen atom per molecule and an average of at least three hydroxyl groups per molecule; wherein the curative system has a plurality of reactive hydrogen groups and the isocyanate terminated urethane prepolymer has a plurality of unreacted NCO groups; and, wherein a stoichiometric ratio of the reactive hydrogen groups to the unreacted NCO groups is 0.7 to 1.2.

The present invention provides a chemical mechanical polishing pad, comprising: a polishing layer having a polishing surface; and, an endpoint detection window; wherein the endpoint detection window comprises a reaction product of ingredients, comprising: (i) an isocyanate terminated urethane prepolymer having 5.5 to 9.5 wt % unreacted NCO groups, wherein the isocyanate terminated urethane prepolymer is a reaction product of ingredients comprising: (a) an aromatic polyfunctional isocyanate; and, (b) a prepolymer polyol; and, (ii) a curative system, comprising: 0 to 90 wt % of a difunctional curative; and, 10 to 100 wt % of an amine initiated polyol curative having at least one nitrogen atom per molecule and an average of at least three hydroxyl groups per molecule; and, wherein the endpoint detection window exhibits a density of $\geq 1$ g/cm$^3$; a porosity of less than 0.1 vol %; a Shore D hardness of 35 to 65; an elongation to break of <300%; and, a double pass transmission at 400 nm, $DPT_{400}$, of 25 to 100%.

The present invention provides a chemical mechanical polishing pad, comprising: a polishing layer having a polishing surface; and, an endpoint detection window; wherein the endpoint detection window comprises a reaction product of ingredients, comprising: (i) an isocyanate terminated urethane prepolymer having 5.5 to 9.5 wt % unreacted NCO groups, wherein the isocyanate terminated urethane prepolymer is a reaction product of ingredients comprising: (a) an aromatic polyfunctional isocyanate; and, (b) a prepolymer polyol; and, (ii) a curative system, comprising: 0 to 90 wt % of a difunctional curative; and, 10 to 100 wt % of an amine initiated polyol curative having at least one nitrogen atom per molecule and an average of at least three hydroxyl groups per molecule; and, wherein the endpoint detection window exhibits a density of $\geq 1$ g/cm$^3$; a porosity of less than 0.1 vol %; a Shore D hardness of 35 to 65; an elongation to break of <300%; a double pass transmission at 400 nm, $DPT_{400}$, of 25 to 100%; a double pass transmission at 800 nm, $DPT_{800}$, of 40 to 100%; and, wherein the endpoint detection window also exhibits a double pass transmission delta between 800 nm and 400 nm, $\Delta DPT_{800-400}$, of <30%.

The present invention provides a chemical mechanical polishing pad, comprising: a polishing layer having a polishing surface; and, an endpoint detection window; wherein the endpoint detection window comprises a reaction product of ingredients, comprising: (i) an isocyanate terminated urethane prepolymer having 5.5 to 9.5 wt % unreacted NCO groups, wherein the isocyanate terminated urethane prepolymer is a reaction product of ingredients comprising: (a) an aromatic polyfunctional isocyanate; and, (b) a prepolymer polyol; and, (ii) a curative system, comprising: 0 to 90 wt % of a difunctional curative; and, 10 to 100 wt % of an amine initiated polyol curative having at least one nitrogen atom per molecule and an average of at least three hydroxyl groups per molecule; wherein the polishing surface has a spiral groove pattern formed therein; and, wherein the polishing surface is adapted for polishing a substrate selected from the group consisting of at least one of a magnetic substrate, an optical substrate and a semiconductor substrate.

The present invention provides a method of making a chemical mechanical polishing pad according to the present invention, comprising: providing a polishing layer having a polishing surface; providing an isocyanate terminated urethane prepolymer having 5.5 to 9.5 wt % unreacted NCO groups, wherein the isocyanate terminated urethane prepolymer is a reaction product of ingredients comprising: an aromatic polyfunctional isocyanate; and, a prepolymer polyol; providing a curative system, comprising: 0 to 90 wt % of a difunctional curative; and, 10 to 100 wt % of an amine initiated polyol curative having at least one nitrogen atom per molecule and an average of at least three hydroxyl groups per molecule; combining the isocyanate terminated urethane prepolymer and the curative system to form a combination; allowing the combination to react to form a product; forming an endpoint detection window from the product; interfacing the endpoint detection window with the polishing layer to provide a chemical mechanical polishing pad.

The present invention provides a method of making a chemical mechanical polishing pad according to the present invention, comprising: providing a polishing layer having a polishing surface; providing an isocyanate terminated urethane prepolymer having 5.5 to 9.5 wt % unreacted NCO groups; providing a curative system, comprising: 0 to 90 wt % of a difunctional curative; and, 10 to 100 wt % of an amine initiated polyol curative having at least one nitrogen atom per molecule and an average of at least three hydroxyl groups per molecule; combining the isocyanate terminated urethane prepolymer and the curative system to form a combination; allowing the combination to react to form a product; forming an endpoint detection window from the product; interfacing the endpoint detection window with the polishing layer to provide a chemical mechanical polishing pad; wherein the endpoint detection window is an integral window.

The present invention provides a method of polishing a substrate, comprising: providing a chemical mechanical polishing apparatus having a platen, a light source and a photosensor; providing at least one substrate; providing a chemical mechanical polishing pad according to claim 1; installing onto the platen the chemical mechanical polishing pad; optionally, providing a polishing medium at an interface between the polishing surface and the substrate; creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor.

The present invention provides a method of polishing a substrate, comprising: providing a chemical mechanical polishing apparatus having a platen, a light source and a photosensor; providing at least one substrate; providing a chemical mechanical polishing pad according to claim 1; installing onto the platen the chemical mechanical polishing pad; optionally, providing a polishing medium at an interface between the polishing surface and the substrate; creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor; wherein the at least one substrate is selected from the group consisting of at least one of a magnetic substrate, an optical substrate and a semiconductor substrate.

DETAILED DESCRIPTION

Figure 1:
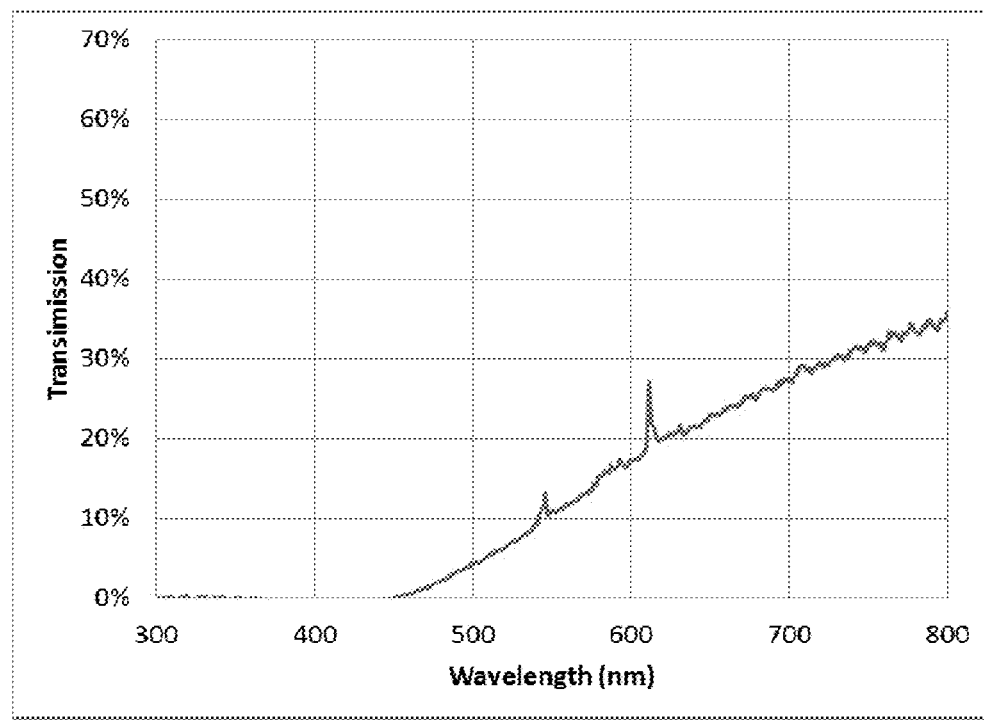
FIG. 1 is a plot of the double pass transmission, DPT, as a function of the wavelength of light as measured under the conditions set forth in the Examples for an endpoint detection window prepared according to Comparative Example C3.

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such polishing process endpoint detection techniques, the chemical mechanical polishing pad of the present invention have an endpoint detection window comprising the reaction product of a unique set of ingredients, which reaction product exhibits a unique combination of hardness Shore D hardness of 35 to 65) and a low tensile elongation (i.e., elongation to break <300%) coupled with good optical properties (i.e., a double pass transmission at 400 nm, $DPT_{400}$, of 25 to 100%) to facilitate polishing end point detection; wherein the endpoint detection window formulation does not exhibit undesirable window deformation (i.e., excessive bulging) and have the required durability for demanding polishing applications.

The term "polishing medium" as used herein and in the appended claims encompasses particle containing polishing solutions and non-particle-containing polishing solutions, such as abrasive free and reactive liquid polishing solutions.

The term "double pass transmission" or "DPT" as used herein and in the appended claims in reference to an endpoint detection window is determined using the following equation:

$$DPT = (IW_{Si} - IW_D) \div (IA_{Si} - IA_D)$$

wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light through the thickness, $T_W$, of the window and measuring at the point of origin the intensity of light reflected back through the thickness of the window, $T_W$, from a surface positioned against a second face of the endpoint detection window substantially parallel to the first face; wherein $IW_{Si}$ is a measurement of the intensity of light that passes through the window from the point of origin and reflects off the surface of a silicon blanket wafer placed against a second face of the window back through the window to the point of origin; wherein $IW_D$ is a measurement of the intensity of light that passes from the point of origin through the window and reflects off the surface of a black body and back through the window to the point of origin; wherein $IA_{Si}$ is a measurement of the intensity of light that passes from the point of origin through a thickness of air equivalent to the thickness, $T_W$, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light reflected off a black body at the light emitting surface of the 3 mm fiber optic cable.

The term "$DPT_{400}$" as used herein and in the appended claims is the DPT exhibited by an endpoint detection window for light having a wavelength of 400 nm.

The term "$DPT_{800}$" as used herein and in the appended claims is the DPT exhibited by an endpoint detection window for light having a wavelength of 800 nm.

The term "double pass transmission delta between 800 nm and 400 nm" or "$\Delta DPT_{800-400}$" as used herein and in the appended claims is the difference in the double pass transmission exhibited by an endpoint detection window for light having a wavelength of 800 nm and for light having a wavelength of 400 nm determined using the following equation:

$$\Delta DPT_{800-400} = DPT_{800} - DPT_{400}$$

The chemical mechanical polishing pad of the present invention, comprises: a polishing layer having a polishing surface; and, an endpoint detection window; wherein the endpoint detection window comprises a reaction product of ingredients, comprising: (i) an isocyanate terminated urethane prepolymer having 5.5 to 9.5 wt % (preferably, 5.75 to 9.0 wt %) unreacted NCO groups, wherein the isocyanate terminated urethane prepolymer is a reaction product of ingredients comprising: (a) an aromatic polyfunctional isocyanate; and, (b) a prepolymer polyol; and, (ii) a curative system, comprising: 0 to 90 wt % (preferably, 0 to 75 wt %; more preferably, 0 to 70 wt %) of a difunctional curative; and, 10 to 100 wt % (preferably, 25 to 100 wt %; more preferably, 30 to 100 wt %) of an amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule.

The polishing layer of the chemical mechanical polishing pad of the present invention has a polishing surface adapted for polishing a substrate. Preferably, the polishing surface is adapted for polishing a substrate selected from at least one of a magnetic substrate, an optical substrate and a semiconductor substrate, More preferably, the polishing surface is adapted for polishing a semiconductor substrate.

The polishing layer of the chemical mechanical polishing pad of the present invention is preferably made of a polymeric material comprising a polymer selected from polycarbonates, polysulfones, nylons, polyethers, polyesters, polystyrenes, acrylic polymers, polymethyl methacrylates, polyvinylchlorides, polyethylenes, polypropylenes, polybutadienes, polyethylene imines, polyurethanes, polyether sulfones, polyamides, polyether imides, polyketones, epoxies, silicones, EPDM, and combinations thereof. Preferably, the polishing layer comprises a polyurethane. One of ordinary skill in the art will understands to select a polishing layer having a thickness suitable for use in a chemical mechanical polishing pad for a given polishing operation. Preferably, the polishing layer exhibits an average thickness of 20 to 150 mils (more preferably 30 to 125 mils; most preferably 40 to 120 mils).

Preferably, the polishing surface has macrotexture selected from at least one of perforations and grooves, Perforations can extend from the polishing surface part way Or all the way through the thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, polishing layer of the chemical mechanical polishing pad of the present invention has a polishing surthce adapted for polishing the substrate, wherein the polishing surface has a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

The isocyanate terminated urethane prepolymer used in the formation of the endpoint detection window of the chemical mechanical polishing pad of the present invention is an isocyanate terminated urethane prepolymer having 5.5 to 9.5 wt % (preferably, 5.75 to 9.0 wt %) unreacted NCO groups, wherein the isocyanate terminated urethane prepolymer is a reaction product of ingredients, comprising: an aromatic polyfunctional isocyanate and a prepolymer polyol.

The isocyanate terminated urethane prepolymer used in the formation of the endpoint detection window of the chemical mechanical polishing pad of the present invention preferably contains an average of two reactive isocyanate groups (i.e., NCO) per molecule.

The isocyanate terminated urethane prepolymer used in the formation of the endpoint detection window of the chemical mechanical polishing pad of the present invention is preferably a low free isocyanate terminated urethane prepolymer having less than 0.1 wt % free toluene diisocyanate (TDI) monomer content.

Preferably, the aromatic polyfunctional isocyanate used in the preparation of the isocyanate terminated urethane prepolymer used in the formation of the endpoint detection window of the chemical mechanical polishing pad of the present invention is an aromatic diisocyanate. More preferably, the aromatic polyfunctional isocyanate is selected from the group consisting of 2,4-toluene di isocyanate, 2,6-toluene diisocyanate; 4,4'-diphenylmethane diisocyanate; naphthalene-1,5-diisocyanate; tolidine diisocyanate; para-phenylene diisocyanate; xylylene diisocyanate; and, mixtures thereof. Most preferably, the aromatic polyfunctional isocyanate used is selected from the group consisting of 2,4-toluene diisocyanate; 2,6-toluene diisocyanate; and, mixtures thereof.

Prepolymer polyol used in the preparation of the isocyanate terminated urethane (prepolymer is (preferably selected from the group consisting of diols, polyols, polyol diols, copolymers thereof, and mixtures thereof. More preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; potycaprolactone polyols; mixtures thereof; and, mixtures thereof with one or more low molecular weight polyols selected from the group consisting of ethylene glycol; 1,2-propylene glycol; 1,3-propylene glycol; 1,2-butariediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene Still more preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Most preferably, the prepolymer polyol includes PPG mixed with at least one of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; di cue glycol; and, tripropylene glycol.

The curative system used in the formation of the endpoint detection window of the chemical mechanical polishing pad of the present invention preferably contains: 0 to 90 wt % (preferably, 0 to 75 wt %; more preferably, 0 to 70 wt %) of a difunctional curative; and, 10 to 100 wt % (preferably, 25 to 100 wt %; more preferably, 30 to 100 wt %) of an amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule. Preferably, the curative system used in the formation of the endpoint detection window of the chemical mechanical polishing pad of the present invention contains <wt % (preferably, <0.1 wt %; more preferably, <0.01 wt %) of a high molecular weight polyol curative having a number average molecular weight, $M_N$, of 2,000 to 100,000 and an average of 3 to 10 hydroxyl groups per molecule. More preferably, the curative system used in the formation of the endpoint detection window of the chemical mechanical polishing pad of the present invention comprises: 0 to 90 wt % (preferably, 0 to 75 wt %; more preferably, 0 to 70 wt %) of a difunctional curative; 10 to 100 wt % (preferably, 25 to 100 wt %; more preferably, 30 to 100 wt %) of an amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule; and, <0.001 wt % of a high molecular weight polyol curative having a number average molecular weight, $M_N$, of 2,000 to 100,000 and an average of 3 to 10 hydroxyl groups per molecule. Most preferably, the curative system used in the formation of the endpoint detection window of the chemical mechanical polishing pad of the present invention comprises: 0 to 90 wt % (preferably, 0 to 75 wt %; more preferably, 0 to 70 wt %) of a difunctional curative; 10 to 100 wt % (preferably, 25 to 100 wt %; more preferably, 30 to 100 wt %) of an amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule; and, <a detectable amount of a high molecular weight polyol curative having a number average molecular weight, $M_N$, of 2,000 to 100,000 and an average of 3 to 10 hydroxyl groups per molecule.

The amine initiated polyol curative used in the formation of the endpoint detection window of the chemical mechanical polishing pad of the present invention, contains at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule. Preferably, the amine initiated polyol curative used in the formation of the endpoint detection window of the chemical mechanical polishing pad of the present invention has a number average molecular weight, $M_N$, ≤700 (more preferably, 150 to 650; still more preferably, 200 to 500; most preferably, 250 to 300).

The amine initiated polyol curative used in the formation of the endpoint detection window of the chemical mechanical polishing pad of the present invention preferably has a hydroxyl number (as determined by ASTM Test Method D4274-11) of 350 to 1,200 mg KOH/g (more preferably, 400 to 1,000 mg KOH/g; most preferably, 600 to 850 mg KOH/g).

Examples of commercially available amine initiated polyol curatives include the Voranol® family of amine initiated polyols (available from The Dow Chemical Company); the Quadrole® Specialty Polyols (N,N,N',N'-tetrakis (2-hydroxypropyl ethylene diamine)) (available from BASF); Pluracol® amine based polyols (available from BASF); Multranol® amine based polyols (available from Bayer MaterialScience LLC); triisopropanotamine (TIPA) (available from The Dow Chemical Company); and, triethanolamine (TEA) (available from Mallinckrodt Baker Inc.). A number of preferred amine initiated polyol curatives are listed in TABLE 1.

TABLE 1

| Amine initiated polyol curative | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

Without wishing to be bound by theory, in addition to promoting the desired balance of physical properties in the endpoint detection window produced therewith, it is believed that the concentration of the amine initiated polyol curative used in the curative system also acts to auto catalyze its reaction and the reaction of any difunctional curative in the curative system with the unreacted isocyanate (NCO) groups present in the isocyanate terminated urethane prepolymer.

The difunctional curative used in the formation of the endpoint detection window of the chemical mechanical polishing pad of the present invention, is preferably selected from diols and diamines. More preferably, the difunctional curative is a difunctional aromatic curative selected from the group consisting of diethyltoluenediamine (DETDA); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) (MCDEA); polytetramethyleneoxide-di-p-aminobenzoate; diphenyl methane; p,p'-methylene dianiline (MDA); m-phenylenediamine (MPDA); 4,4'-methylene-bis-(2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3'-tetrachloro diamino diphenylmethane; trimethylene glycol di-p-aminobenzoate; and mixtures thereof. Still more preferably, the difunctional aromatic curative used is selected from the group consisting of 4,4'-methylene-bis-(2-chloroaniline) (MBOCA); 4,4'-methylene-bis-(3-chloro-2,6-diethylaniline) (MCDEA); and, isomers thereof. Most preferably, the difunctional aromatic curative used is 4,4'-methylene-bis-(2-chloroanitine) (MBOCA).

The sum of the reactive hydrogen groups (i.e., the sum of the amine ($NH_2$) groups and the hydroxyl (OH) groups) contained in the components of the curative system divided by the unreacted isocyanate (NCO) groups in the isocyanate terminated urethane prepolymer (i.e., the stoichiometric ratio) used in the formation of the endpoint detection window of the chemical mechanical polishing pad of the present invention is preferably 0.7 to 1.2 (preferably, 0.8 to 1.10; more preferably, 0.95 to 1.05; most preferably, 0.98 to 1.02).

The endpoint detection window of the chemical mechanical polishing pad of the present invention preferably exhibits a density of ≥1 g/cm$^3$ (preferably, 1.05 to 1.2 g/cm$^3$; more preferably 1.1 to 1.2 g/cm$^2$); a porosity of less than 0.1 vol %; a Shore D hardness of 35 to 65; an elongation to break of <300% (preferably, 100 to <300%; more preferably, 150 to 250%; most preferably, 175 to 245%); and, a double pass transmission at 400 nm, DPT$_{400}$ of 25 to 100% (preferably, 25 to 85%; more preferably, 25 to 80%; most preferably, 25 to 65%) as measured under the conditions set forth herein in the Examples.

The endpoint detection window of the chemical mechanical polishing pad of the present invention preferably exhibits a double pass transmission at 800 nm, DPT$_{800}$, of 25 to 100% (preferably, of 30 to 85%; more preferably, 45 to 80%; most preferably, 40 to 65%) as measured under the conditions set forth herein in the Examples. Preferably, the endpoint detection window of the chemical mechanical polishing pad of the present invention exhibits a DPT$_{800}$ of 25 to 100% (preferably, of 30 to 85%; more preferably, 45 to 80%; most preferably, 40 to 65%) as measured under the conditions set forth herein in the Examples; and, a double pass transmission at 400 nm, DPT$_{400}$, of 25 to 100% (preferably, of 25 to 85%; more preferably, 25 to 80%; most preferably, 25 to 65%) as measured under the conditions set forth herein in the Examples; and, wherein the endpoint detection window exhibits a double pass transmission delta between 800 nm and 400 nm ΔDPT$_{800-400}$, of <30%≤25% (more preferably, ≤15%; most preferably, ≤0.10%) as measured under the conditions set forth herein in the Examples.

The endpoint detection window of the chemical mechanical polishing pad of the present invention is preferably selected from a plug in place window and an integral window. More preferably, the endpoint detection window is an integral window incorporated into the polishing layer.

The chemical mechanical polishing pad of the present invention optionally further comprises at least one additional layer interfaced with the polishing layer. Preferably, the polishing layer is interfaced with the at least one additional layer using an adhesive. The adhesive can be selected from pressure sensitive adhesives, hot melt adhesives, contact adhesives and combinations thereof. Preferably, the adhesive is a hot melt adhesive or a pressure sensitive adhesive. More preferably, the adhesive is a hot melt adhesive.

The chemical mechanical polishing pad of the present invention is preferably adapted to be interfaced with a platen of a polishing machine. Preferably, the chemical mechanical polishing pad is adapted to be affixed to the platen of the polishing machine, Preferably, the chemical mechanical polishing pad can be affixed to the platen using at least one of a pressure sensitive adhesive and vacuum. Preferably, the chemical mechanical polishing pad of the present invention further comprises a pressure sensitive platen adhesive to facilitate affixing to the platen. One of ordinary skill in the art will know how to select an appropriate pressure sensitive adhesive for use as the pressure sensitive platen adhesive. Preferably, the chemical mechanical polishing pad of the present invention will also include a release liner applied over the pressure sensitive platen adhesive.

The method of making a chemical mechanical polishing pad of the present invention, comprises: providing a polishing layer having a polishing surface; providing an isocyanate terminated urethane prepolymer having 5.5 to 9.5 wt % (preferably, 5.75 to 9.0 wt %) unreacted NCO groups, wherein the isocyanate terminated urethane prepolymer is a reaction product of ingredients comprising: (a) an aromatic polyfunctional isocyanate; and, (b) prepolymer polyol; providing a curative system, comprising: 0 to 90 wt % (preferably, 0 to 75 wt %; more preferably, 0 to 70 wt %) of a difunctional curative; and, 10 to 100 wt % (preferably, 25 to 100 wt %; more preferably, 30 to 100 wt %) of an amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to live; most preferably, four) hydroxyl groups per molecule; combining the isocyanate terminated urethane prepolymer and the curative system to form a combination; allowing the combination to react to form a product; forming an endpoint detection window from the product; interfacing the endpoint detection window with the polishing layer to provide a chemical mechanical polishing pad. Preferably, the endpoint detection window is interfaced with the polishing layer as an integral window incorporated into the polishing layer using known techniques or as a plug in place window incorporated into the chemical mechanical polishing pad using known techniques. Most preferably, the endpoint detection window is incorporated into the polishing layer as an integral window.

The method of the present invention for chemical mechanical polishing of a substrate comprises: providing a chemical mechanical polishing apparatus having a platen, a tight source and a photosensor (preferably a multisensor spectrograph); providing at least one substrate to be polished (preferably, wherein the substrate is selected from the group consisting of at least one of a magnetic substrate, an optical substrate and a semiconductor substrate; more preferable, wherein the substrate is a semiconductor substrate; most preferably, wherein the substrate is a semiconductor wafer); providing a chemical mechanical polishing pad of the present invention; installing onto the platen the chemical mechanical polishing pad; optionally, providing a polishing medium at an interface between a polishing surface of the chemical mechanical polishing pad and the substrate (preferably, wherein the polishing medium is selected from the group consisting of a polishing slurry and a non-abrasive containing reactive liquid formulation); creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor. Preferably, the polishing endpoint is determined based on an analysis of a wavelength of light reflected off the surface of the substrate and transmitted through the endpoint detection window, wherein the wavelength of light has a wavelength of >370 nm to 800 nm. More preferably, the polishing endpoint is determined based on an analysis of multiple wavelengths of light reflected off the surface of the substrate and transmitted through the endpoint detection window, wherein one of the wavelengths analyzed has a wavelength of >370 nm to 800 nm.

Some embodiments of the present invention will now be described in detail in the following Examples.

Comparative Examples C1-C4 and Examples 1-6

Endpoint detection windows were prepared according to the formulation details provided in TABLE 2. The window prepolymer was mixed with the components of the curative system using a vortex mixer at 1,000 rpm for 30 seconds. All of the raw materials, except for the difunctional curative (i.e., MBOCA and MCDEA), were maintained at a premixing temperature of 60° C. The MBOCA and MCDEA when used were maintained at a premixing temperature of 120° C.

The stoichiometric ratio between the window prepolymer and the curative system used for the endpoint detections windows is provided in TABLE 2 as the ratio of the reactive hydrogen groups (i.e., the sum of the —OH groups and —NH$_2$ groups) in the curative system to the unreacted isocyanate (NCO) groups in the isocyanate terminated urethane prepolymer.

Figure 2:
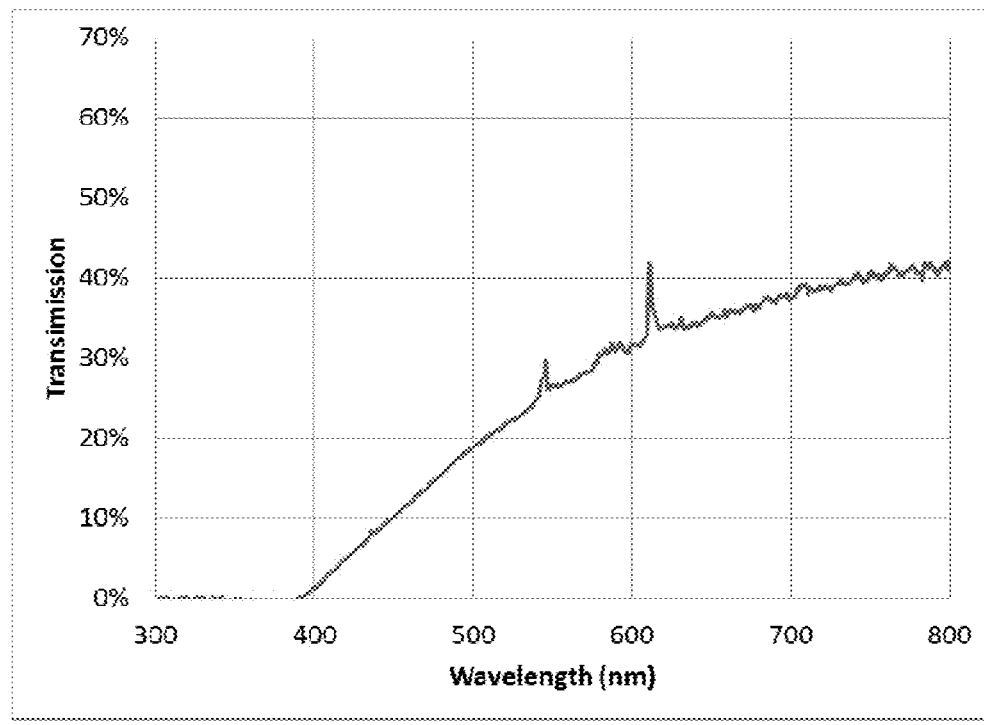
FIG. 2 is a plot of the double pass transmission, DPT, as a function of the wavelength of light as measured under the conditions set forth in the Examples for an endpoint detection window prepared according to Comparative Example C4.
Figure 3:
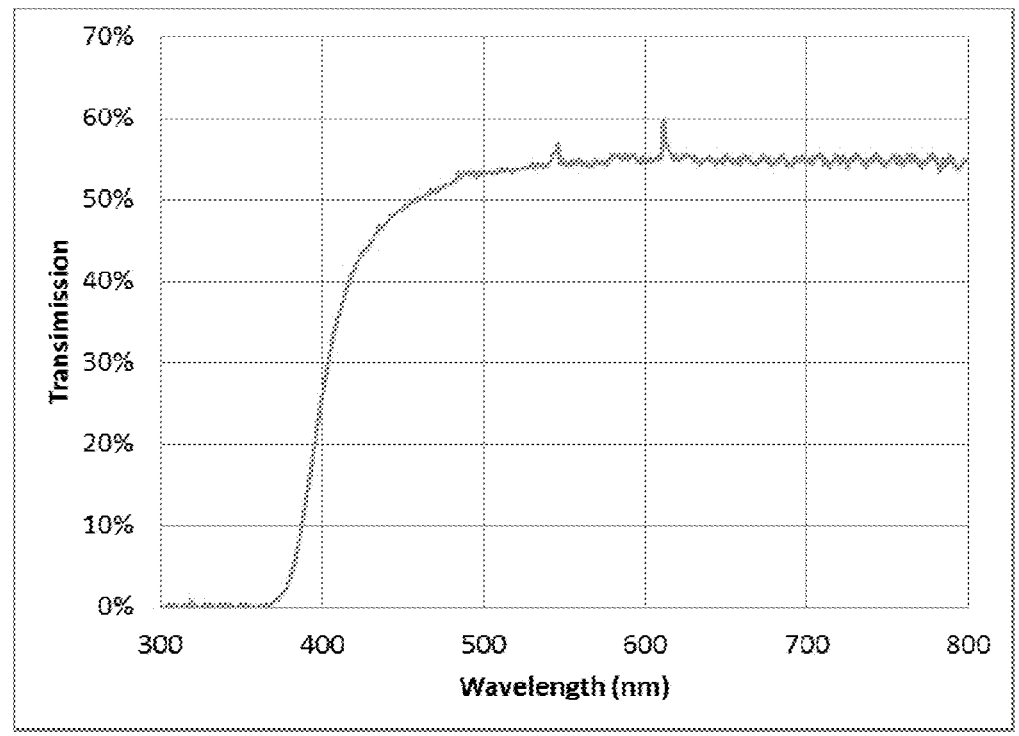
FIG. 3 is a schematic plot of the double pass transmission, DPT, as a function of the wavelength of light as measured under the conditions set forth in the Examples for an endpoint detection window prepared according to Example 3.
Figure 4:
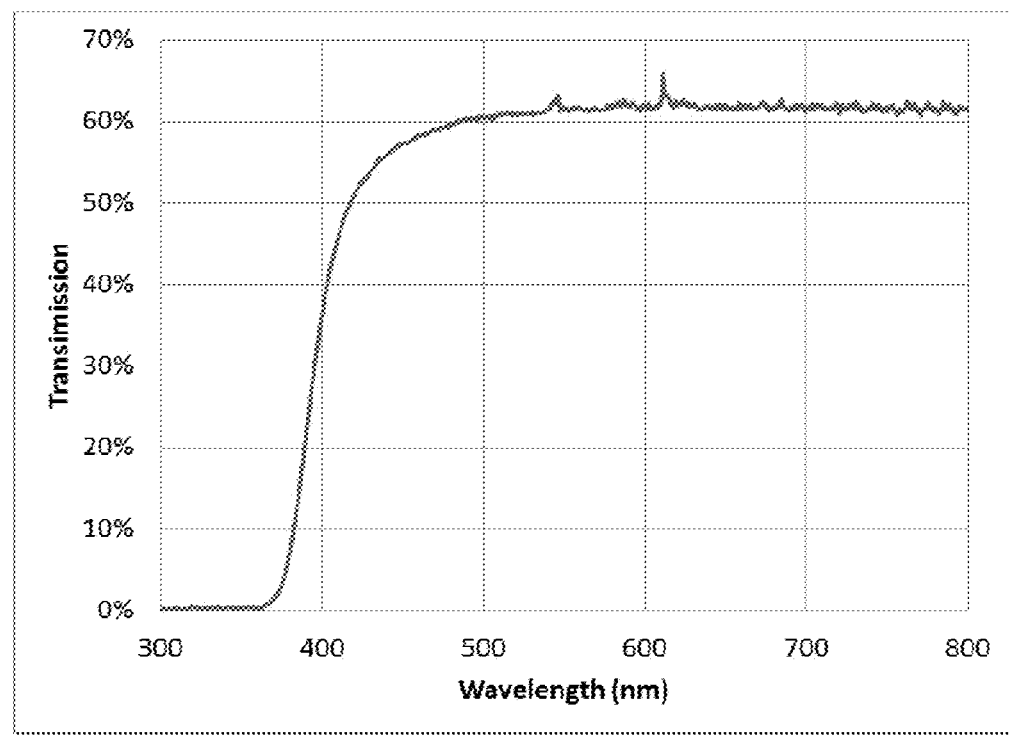
FIG. 4 is a schematic plot of the double pass transmission, DPT, as a function of the wavelength of light as measured under the conditions set forth in the Examples for an endpoint detection window prepared according to Example 4.
Figure 5:
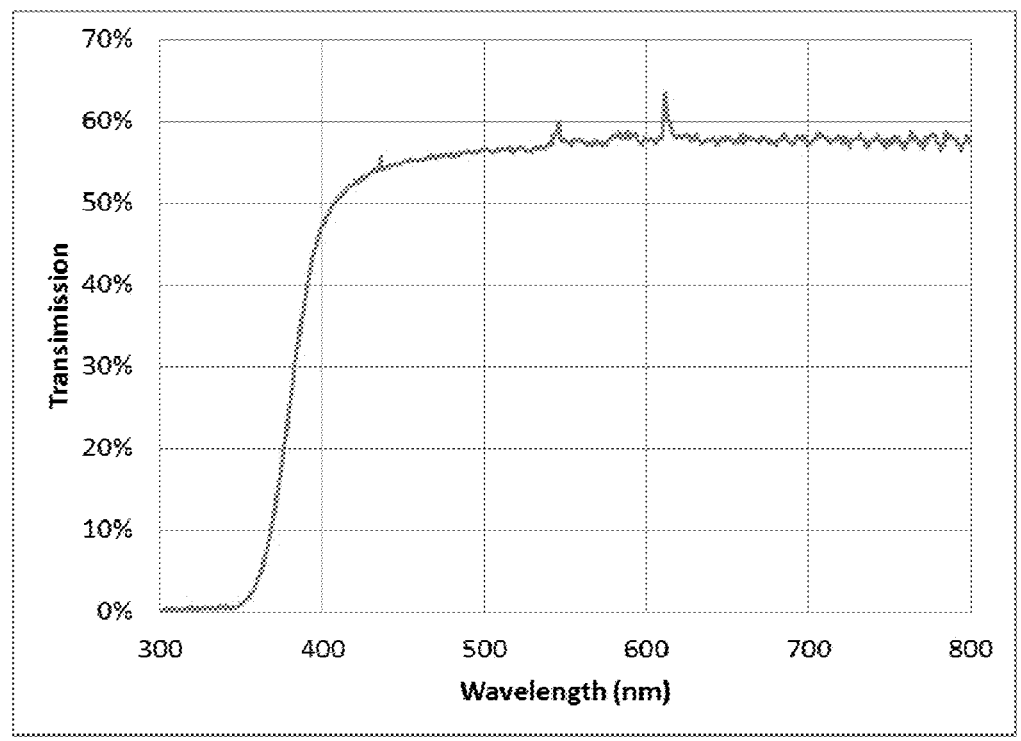
FIG. 5 is a schematic plot of the double pass transmission, DPT, as a function of the wavelength of light as measured under the conditions set forth in the Examples for an endpoint detection window prepared according to Example 5.
Figure 6:
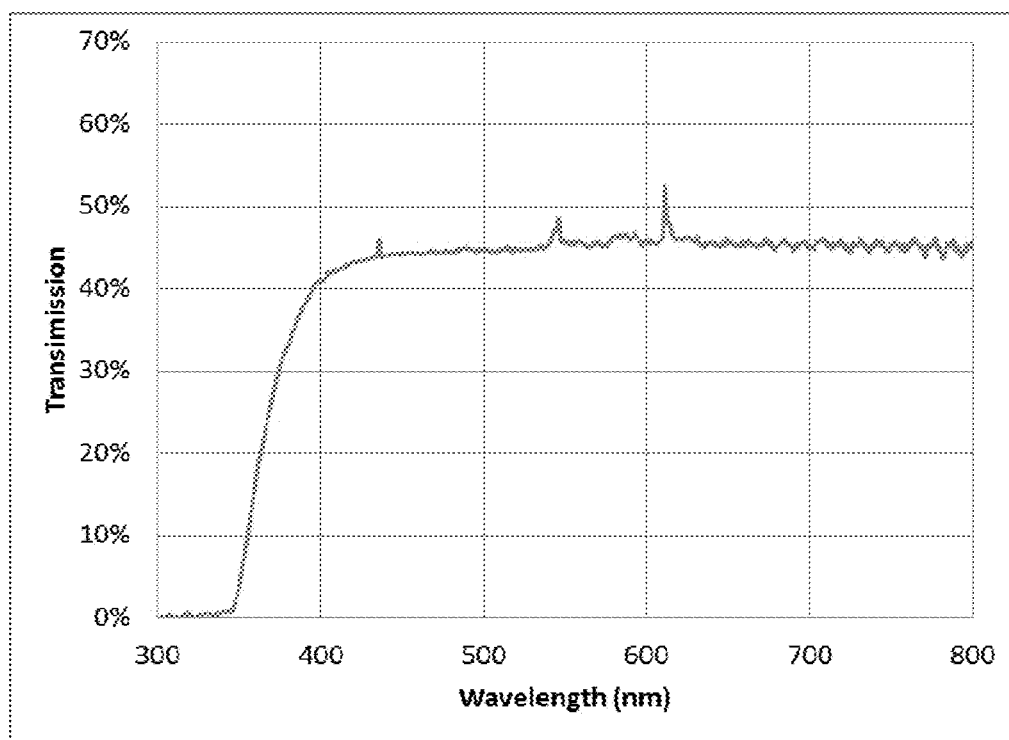
FIG. 6 is a schematic plot of the double pass transmission, DPT, as a function of the wavelength of light as measured under the conditions set forth in the Examples for an endpoint detection window prepared according to Example 6.

In each of the Examples, the isocyanate terminated urethane prepolymer and the curative system were mixed together using a vortex mixer. After mixing, the combination was dispensed into a pocket mold with dimensions of 2 mm×125 mm×185 mm. The pocket mold with the dispensed combination was then cured in an oven for eighteen (18) hours. The set point temperature for the oven was initially set at 93° C. for the first twenty (20) minutes; 104° C. for the following fifteen (15) hours and forty (40) minutes; and then dropped to 21° C. for the final two (2) hours. The pocket mold and its contents was then removed from the oven and the product endpoint detection window was then removed from the pocket mold.

the surface of a black body and back through the window to the point of origin; wherein $IA_{Si}$ is a measurement of the intensity of light at the given wavelength that passes from the point of origin through a thickness of air equivalent to the thickness, $T_W$, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light at the given wavelength reflected off a black body at the light emitting surface of the 3 mm fiber optic cable. A graph of the observed double pass transmission versus wavelength of light from 300 to 800 nm for the endpoint detection windows prepared according to Comparative Examples C3-C4 and Examples 3-6 are depicted in FIGS. 1-6, respectively.

The density data reported for the endpoint detection windows was determined according to ASTM D1622.

The Shore D hardness data reported for the endpoint detection windows was determined according to ASTM D2240.

The tensile properties of the endpoint detection windows (i.e., tensile strength and elongation to break) were measured according to ASTM D1708-10 using an Alliance RT/5 mechanical tester available from MTS Systems Corporation at a crosshead speed of 50.8 cm/min. All tensile property testing was performed in a temperature and humidity controlled laboratory set at 23 and a relative humidity of 50%. All of the test samples were conditioned under the noted laboratory conditions for 5 days before performing the testing. The reported tensile strength (MPa) and elongation to break (%) for each endpoint detection window material were determined from stress-strain curves of four replicate samples.

TABLE 2

| Ex # | Isocyanate terminated urethane prepolymer | (% NCO) | Curative System | | | | Stoic. (Active H/NCO) |
|---|---|---|---|---|---|---|---|
| | | | Amine initiated polyol curative (P1) | P1 (wt %) | Difunctional aromatic curative (P2) | P2 (wt %) | |
| C2 | Adiprene ® LFG963A | 5.83 | Voranol ® 800 | 9.1 | MbOCA | 90.9 | 1.0 |
| C3 | Adiprene ® LF750D | 8.86 | Voranol ® 800 | — | MCDEA | 100 | 1.0 |
| C4 | Adiprene ® LF750D | 8.86 | Voranol ® 800 | 9.1 | MbOCA | 90.9 | 1.0 |
| 1 | Adiprene ® LFG963A | 5.83 | Voranol ® 800 | 33.3 | MbOCA | 66.7 | 1.0 |
| 2 | Adiprene ® LFG963A | 5.83 | Voranol ® 800 | 50.0 | MbOCA | 50.0 | 1.0 |
| 3 | Adiprene ® LF750D | 8.86 | Voranol ® 800 | 33.3 | MbOCA | 66.7 | 1.0 |
| 4 | Adiprene ® LF750D | 8.86 | Voranol ® 800 | 50.0 | MbOCA | 50.0 | 1.0 |
| 5 | Adiprene ® LF750D | 8.86 | Voranol ® 800 | 90.9 | MbOCA | 9.1 | 1.0 |
| 6 | Adiprene ® LF750D | 8.86 | Voranol ® 800 | 100 | MbOCA | — | 1.0 |

Adiprene ® LFG963A isocyanate terminated urethane prepolymer is available from Chemtura Corporation.
Adiprene ® LF750D isocyanate terminated urethane prepolymer is available from Chemtura Corporation.
Voranol ® 800 amine initiated polyol curative having a number average molecular weight, $M_N$, of 280; two nitrogen atoms; and an average of four hydroxyl groups per molecule available from The Dow Chemical Company.

The endpoint detection windows prepared according to each of Comparative Examples C1-C4 and Examples 1-6 were analyzed to determine the physical properties as reported in TABLE 3.

The $DPT_{400}$ and $DPT_{800}$ transmission data reported for the endpoint detection windows was determined using the following equation:

$$DPT = (IW_{Si} - IW_D) \div (IA_{Si} - IA_D)$$

wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light at a given wavelength (i.e., at 400 nm and 800 nm, respectively) through the thickness, $T_W$, of the window and measuring at the point of origin the intensity of light of the given wavelength reflected back through the thickness of the window, $T_W$, from a surface positioned against a second face of the endpoint detection window substantially parallel to the first face; wherein $IW_{Si}$ is a measurement of the intensity of light at the given wavelength that passes through the window from the point of origin and reflects off the surface of a silicon blanket wafer placed against a second face of the window back through the window to the point of origin; wherein $IW_D$ is a measurement of the intensity of light at the given wavelength that passes from the point of origin through the window and reflects off

TABLE 3

| | Properties | | | | | | |
|---|---|---|---|---|---|---|---|
| | Double Pass Transmission, DPT, at λ (in %) | | | | Shore D Hardness (15 s) | Tensile strength (MPa) | Elongation to break (%) |
| Ex. # | λ = 400 nm | λ = 800 nm | $\Delta_{800-400}$ | Density (g/cm³) | | | |
| C2 | 17 | 57 | 40 | 1.12 | 50 | 17.6 | 281 |
| C3 | 0 | 33 | 33 | 1.18 | 69 | 50.5 | 296 |
| C4 | 1 | 41 | 40 | 1.18 | 67 | 46.3 | 247 |
| 1 | 36 | 58 | 22 | 1.11 | 43 | 13.0 | 205 |
| 2 | 40 | 61 | 21 | 1.1 | 40 | 12.6 | 210 |
| 3 | 26 | 54 | 28 | 1.16 | 61 | 37.4 | 245 |
| 4 | 36 | 62 | 26 | 1.16 | 55 | 29.5 | 195 |
| 5 | 45 | 55 | 10 | 1.16 | 39 | 23.1 | 208 |
| 6 | 41 | 46 | 5 | 1.16 | 39 | 22.2 | 204 |

We claim:

1. A chemical mechanical polishing pad, comprising:
a polishing layer having a polishing surface; and,
an endpoint detection window;
wherein the endpoint detection window comprises a reaction product of ingredients, comprising:
  (i) an isocyanate terminated urethane prepolymer having 5.5 to 9.5 wt % unreacted NCO groups, wherein the isocyanate terminated urethane prepolymer is a reaction product of ingredients comprising:
    (a) an aromatic polyfunctional isocyanate, wherein the aromatic polyfunctional isocyanate is selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; and mixtures thereof; and,
    (b) a prepolymer polyol, wherein the prepolymer polyol is selected from the group consisting of polyether polyols; polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol; and,
  (ii) a curative system, comprising:
    0 to 70 wt % of a difunctional curative; and,
    30 to 100 wt % of an amine initiated polyol curative having two to four nitrogen atoms per molecule and an average of three to six hydroxyl groups per molecule;
    wherein the curative system contains <1 wt % of a high molecular weight polyol curative having a number average molecular weight, $M_N$, of 2,000 to 100,000 and an average of 3 to 10 hydroxyl groups per molecule; and,
wherein the endpoint detection window exhibits a double pass transmission at 400 nm, $DPT_{400}$, of 25 to 100%; wherein the endpoint detection window exhibits a double pass transmission at 800 nm, $DPT_{800}$, of 40 to 100%, and, wherein the endpoint detection window also exhibits a double pass transmission delta between 800 nm and 400 nm, $\Delta DPT_{800-400}$, of <30%.

2. The chemical mechanical polishing pad of claim 1, wherein the polishing surface is adapted for polishing a substrate selected from the group consisting of at least one of a magnetic substrate, an optical substrate and a semiconductor substrate.

3. The chemical mechanical polishing pad of claim 1, wherein the curative system has a plurality of reactive hydrogen groups and the isocyanate terminated urethane prepolymer has a plurality of unreacted NCO groups; and, wherein a stoichiometric ratio of the reactive hydrogen groups to the unreacted NCO groups is 0.7 to 1.2.

4. The chemical mechanical polishing pad of claim 1, wherein the endpoint detection window exhibits a density of $\geq 1$ g/cm$^3$; a porosity of less than 0.1 vol %; and, a Shore D hardness of 35 to 65; an elongation to break of <300%.

5. The chemical mechanical polishing pad of claim 2, wherein the polishing surface has a spiral groove pattern formed therein.

6. The chemical mechanical polishing pad of claim 1, wherein the curative system is the amine initiated polyol curative having two to four nitrogen atoms per molecule and an average of three to six hydroxyl groups per molecule.

7. The chemical mechanical polishing pad of claim 6, wherein the amine initiated polyol curative has two nitrogen atoms per molecule and an average of four hydroxyl groups per molecule.

* * * * *